United States Patent
Michiue

(10) Patent No.: US 11,081,619 B2
(45) Date of Patent: Aug. 3, 2021

(54) LIGHT-EMITTING ELEMENT AND METHOD OF MANUFACTURING SAME

(71) Applicant: NICHIA CORPORATION, Anan (JP)

(72) Inventor: Atsuo Michiue, Anan (JP)

(73) Assignee: NICHIA CORPORATION, Anan (JP)

( * ) Notice: Subject to any disclaimer, the term of this patent is extended or adjusted under 35 U.S.C. 154(b) by 45 days.

(21) Appl. No.: 16/723,793

(22) Filed: Dec. 20, 2019

(65) Prior Publication Data

US 2020/0212253 A1 Jul. 2, 2020

(30) Foreign Application Priority Data

Dec. 27, 2018 (JP) .............................. JP2018-244450

(51) Int. Cl.
*H01L 33/00* (2010.01)
*H01L 33/08* (2010.01)
(Continued)

(52) U.S. Cl.
CPC ........ *H01L 33/0075* (2013.01); *H01L 21/302* (2013.01); *H01L 33/005* (2013.01);
(Continued)

(58) Field of Classification Search
CPC ..... H01L 33/0075; H01L 33/32; H01L 33/20; H01L 33/08; H01L 27/156; H01L 33/18; H01L 33/005; H01L 33/24; H01L 33/007; H01L 33/075; H01L 2933/0016; H01L 33/44; H01L 33/42; H01L 2933/0066; H01L 2933/003; H01L 21/302; H01L 21/02513; B82Y 30/00; B82Y 40/00; B82Y 20/00

See application file for complete search history.

(56) References Cited

U.S. PATENT DOCUMENTS 10,134,960 B2 * 11/2018 Scholz .................. H01L 33/505
10,403,787 B2 * 9/2019 Zhang .................... H01L 33/18
(Continued)

FOREIGN PATENT DOCUMENTS

| JP | 2015-034115 A | 2/2015 |
| JP | 2015-126048 A | 7/2015 |

(Continued)

*Primary Examiner* — Savitri Mulpuri
(74) *Attorney, Agent, or Firm* — Foley & Lardner LLP

(57) ABSTRACT

A method of manufacturing a light-emitting element includes: forming a plurality of masks on a surface of a first conductive semiconductor layer; forming a plurality of rods comprising a first conductive semiconductor by partially removing, in a depth direction, a portion of the first conductive semiconductor layer exposed from the masks by etching; forming an insulating film on the rods and a surface of a the remaining first conductive semiconductor layer; performing wet etching, in a state in which a mask covering the insulating film is not formed, to remove a first portion of the insulating film on lateral surfaces of the rods but retaining a second portion of the insulating film on a surface of the first conductive semiconductor layer; forming a plurality of light-emitting layers covering the lateral surfaces of the rods; and forming a plurality of second conductive semiconductor layers covering outer peripheries of the light-emitting layers.

8 Claims, 9 Drawing Sheets

(51) Int. Cl.
  *H01L 33/32* (2010.01)
  *H01L 33/20* (2010.01)
  *H01L 21/302* (2006.01)
  *H01L 33/18* (2010.01)

(52) U.S. Cl.
  CPC .............. *H01L 33/08* (2013.01); *H01L 33/18* (2013.01); *H01L 33/20* (2013.01); *H01L 33/32* (2013.01)

(56) References Cited

U.S. PATENT DOCUMENTS

| | | | |
|---|---|---|---|
| 10,608,139 B1 * | 3/2020 | Michiue | H01L 33/08 |
| 2013/0221385 A1 * | 8/2013 | Shibata | H01L 31/052 |
| | | | 257/88 |
| 2013/0341658 A1 * | 12/2013 | Lee | H01L 33/60 |
| | | | 257/91 |
| 2014/0077220 A1 | 3/2014 | Kryliouk et al. | |
| 2014/0138620 A1 | 5/2014 | Svensson et al. | |
| 2014/0363912 A1 | 12/2014 | Ohlsson et al. | |
| 2015/0207033 A1 | 7/2015 | Kryliouk et al. | |
| 2015/0221814 A1 | 8/2015 | Ohlsson et al. | |
| 2015/0263227 A1 * | 9/2015 | Yang | H01L 33/24 |
| | | | 257/88 |
| 2016/0049553 A1 * | 2/2016 | Sim | H01L 33/08 |
| | | | 257/13 |
| 2016/0064609 A1 * | 3/2016 | Cha | H01L 33/08 |
| | | | 257/13 |
| 2016/0099379 A1 | 4/2016 | Svensson et al. | |
| 2016/0118533 A1 * | 4/2016 | Takeuchi | H01L 33/005 |
| | | | 438/47 |
| 2017/0301823 A1 | 10/2017 | Svensson et al. | |
| 2017/0301825 A1 | 10/2017 | Ohlsson et al. | |
| 2020/0365764 A1 * | 11/2020 | Singer | H01L 33/382 |

FOREIGN PATENT DOCUMENTS

| | | |
|---|---|---|
| JP | 2015-532014 A | 11/2015 |
| JP | 2016-004942 A | 1/2016 |
| JP | 2016-502754 A | 1/2016 |
| JP | 2016-527706 A | 9/2016 |
| JP | 2018-137439 A | 8/2018 |

* cited by examiner

[FIG.1]
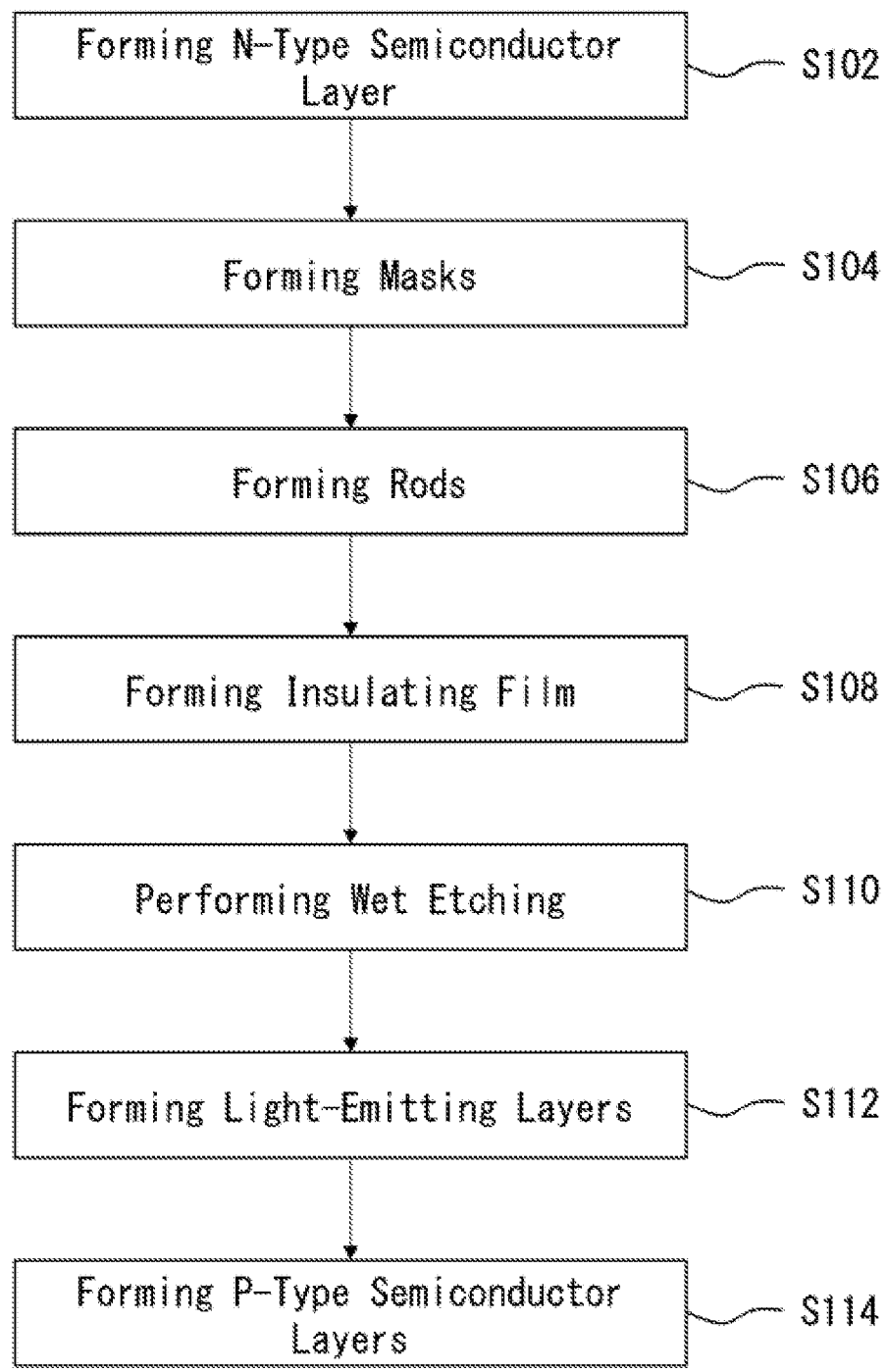

[FIG.2]
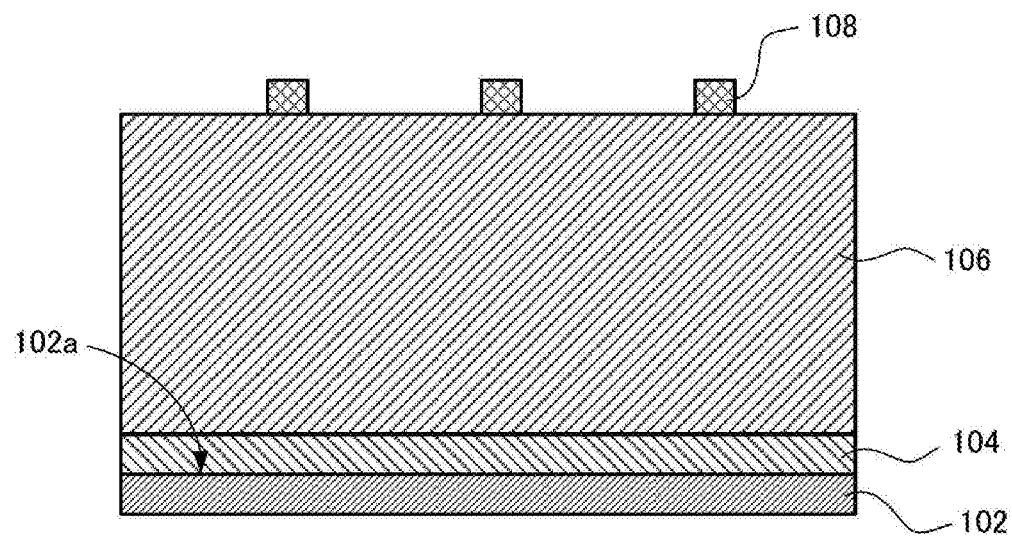
[FIG.3]
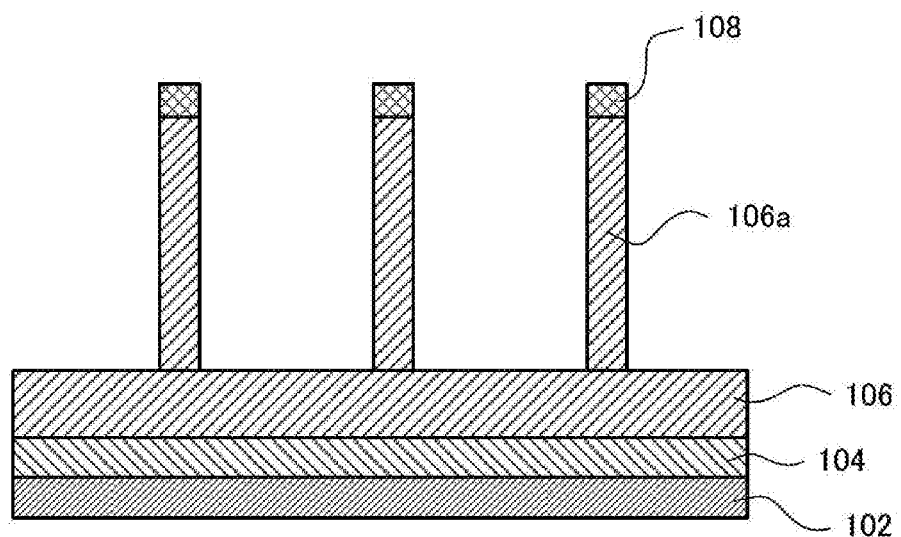

[FIG.4]
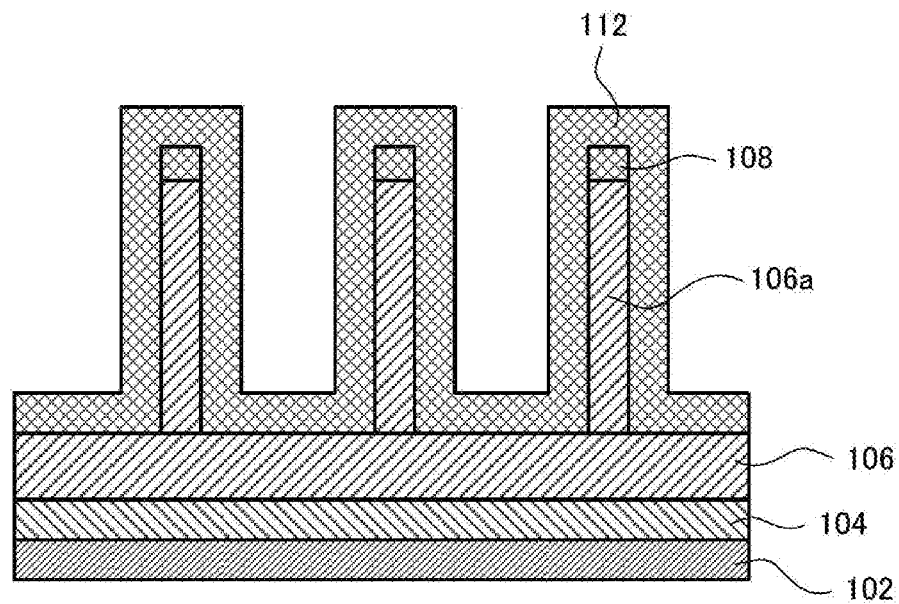
[FIG.5]
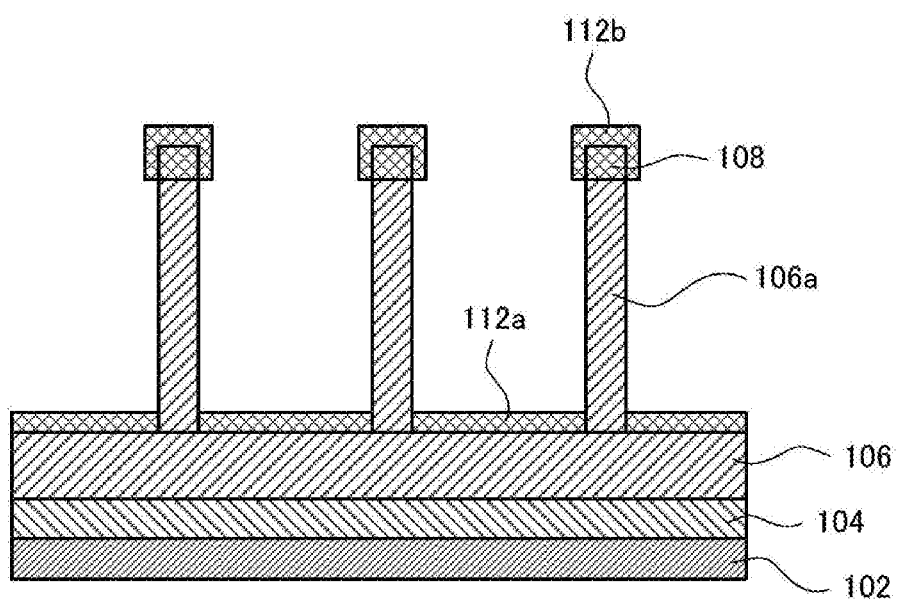

[FIG.6]
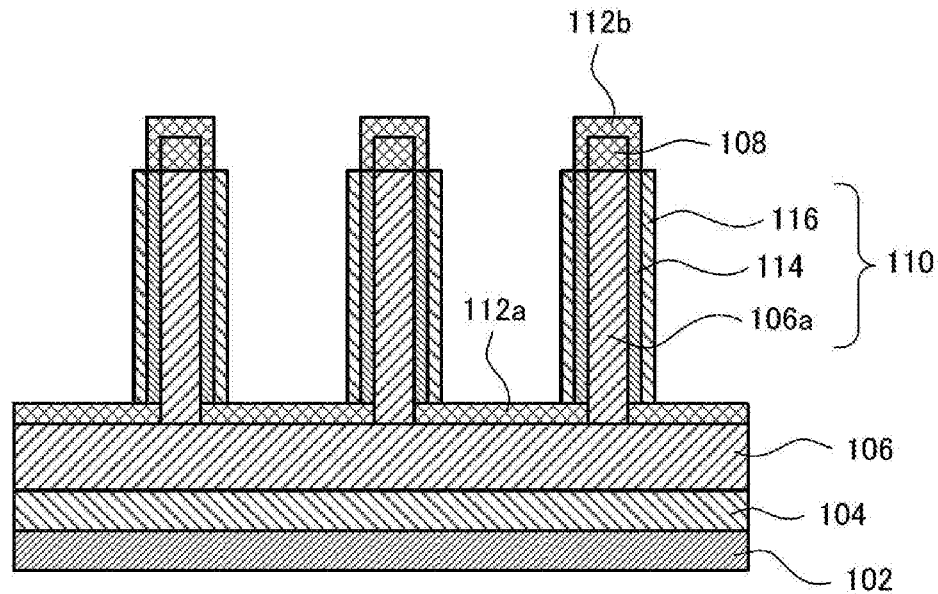
[FIG.7]
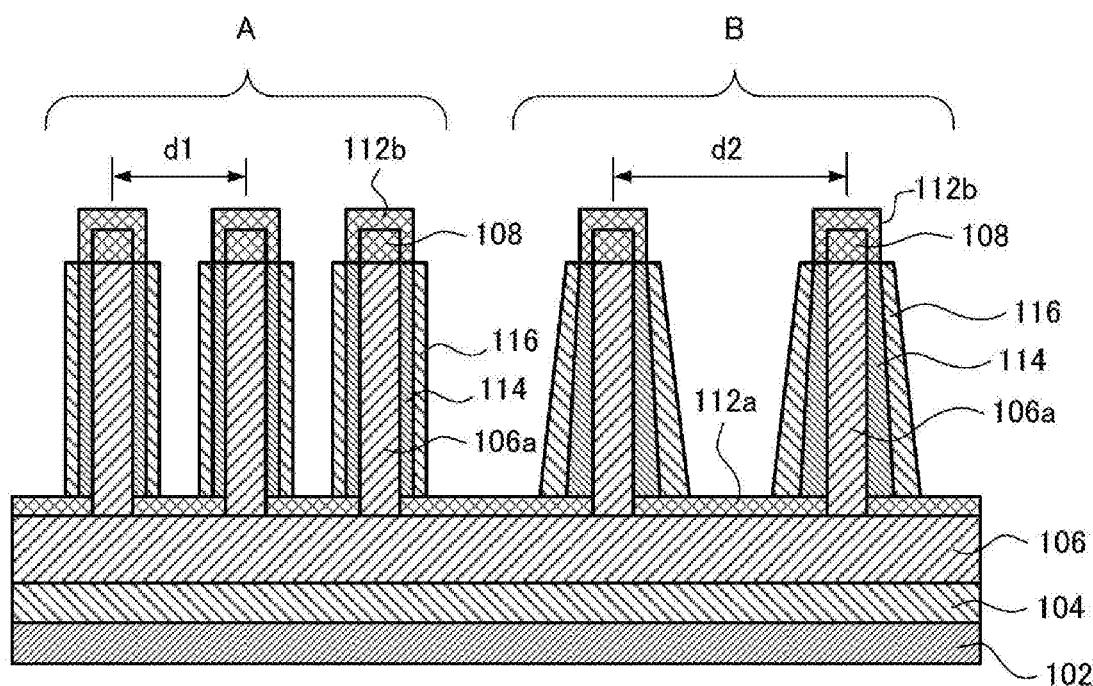

[FIG.8]
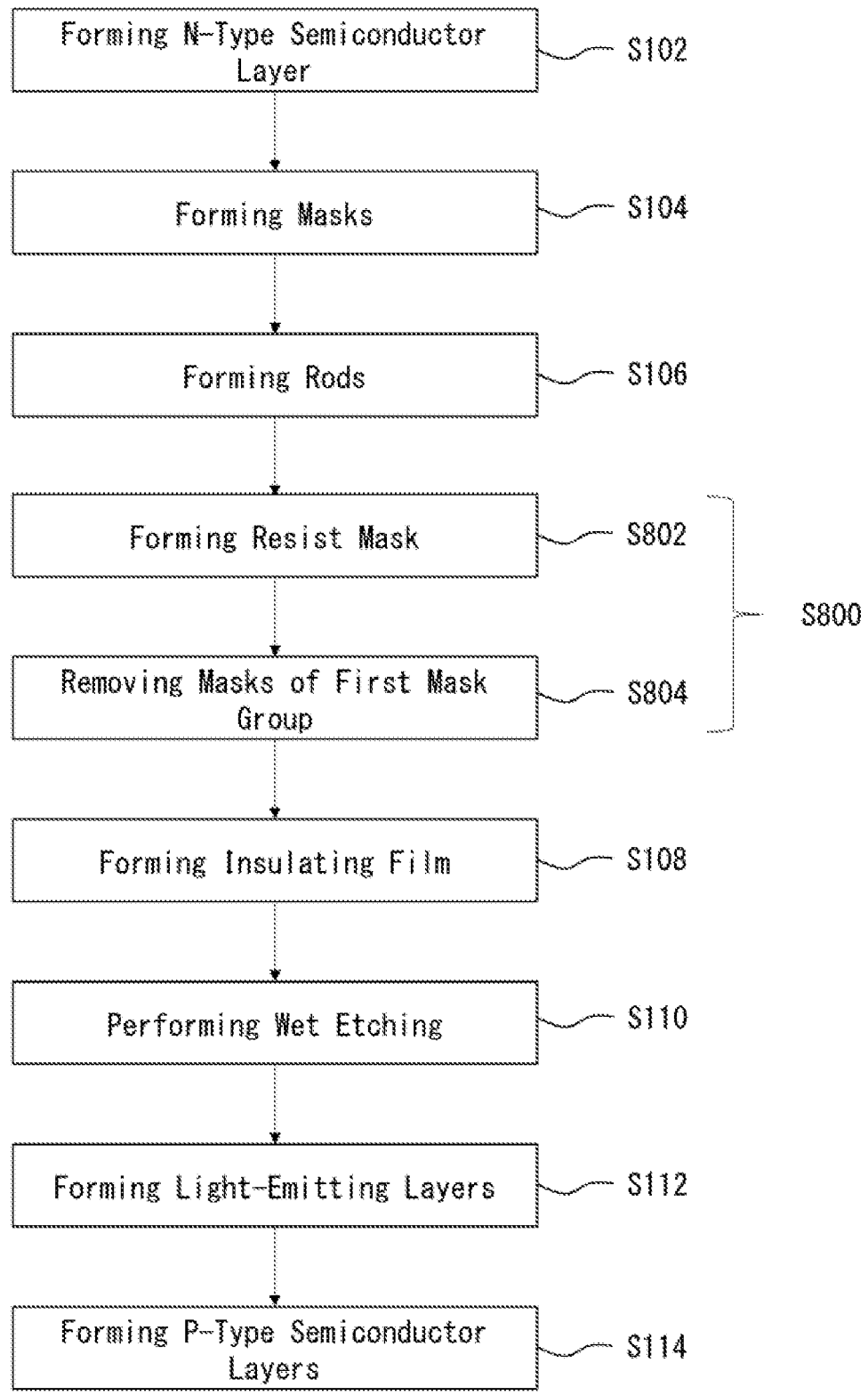

[FIG.9A]
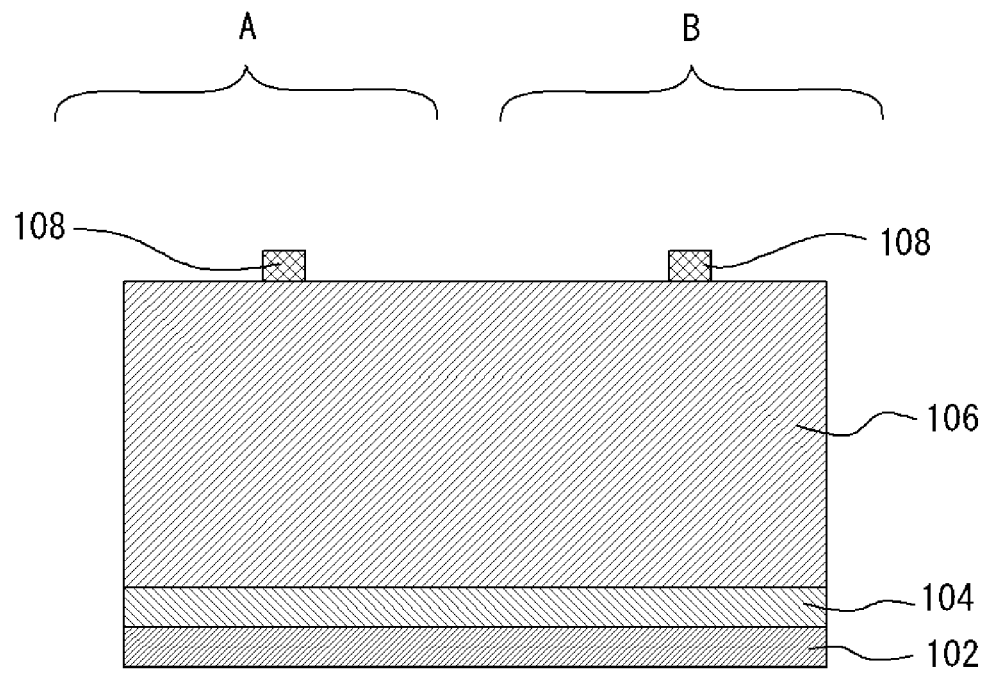
[FIG.9B]
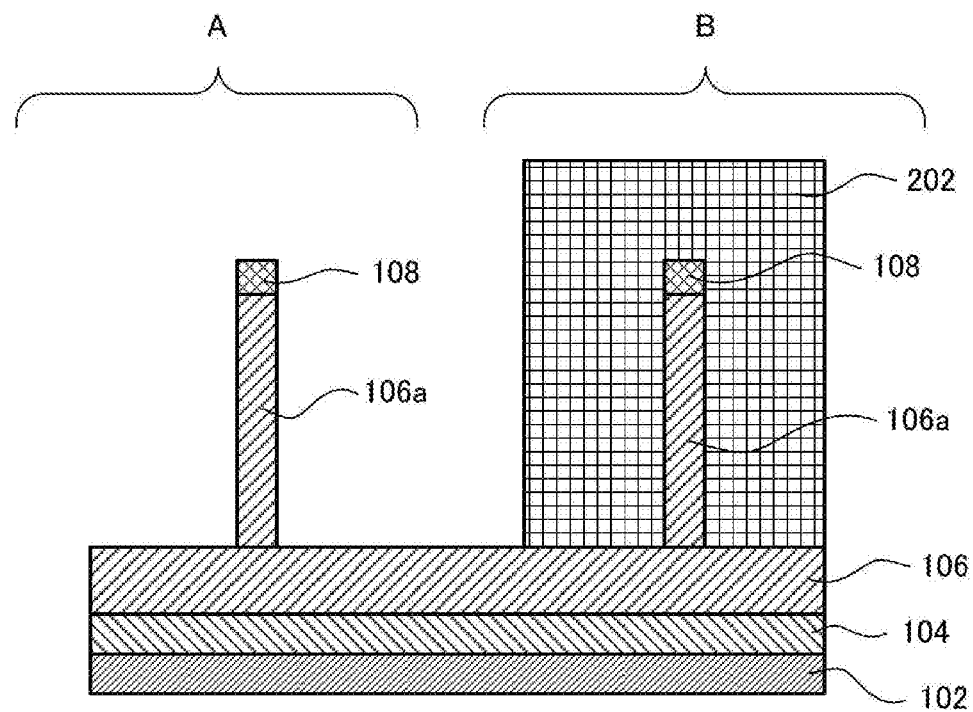

[FIG.10]
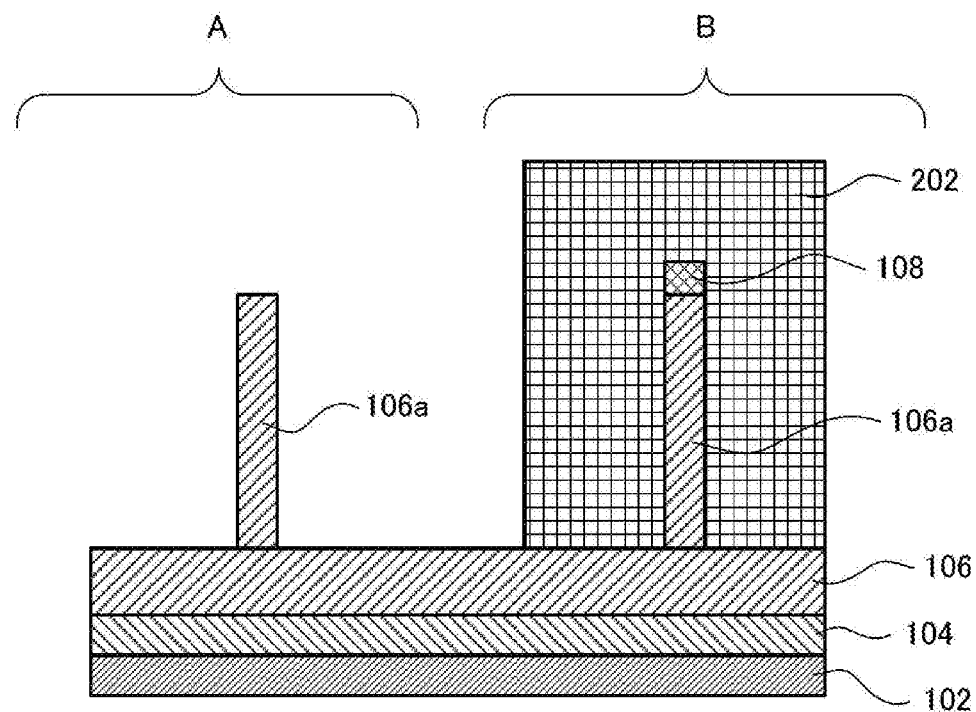
[FIG.11]
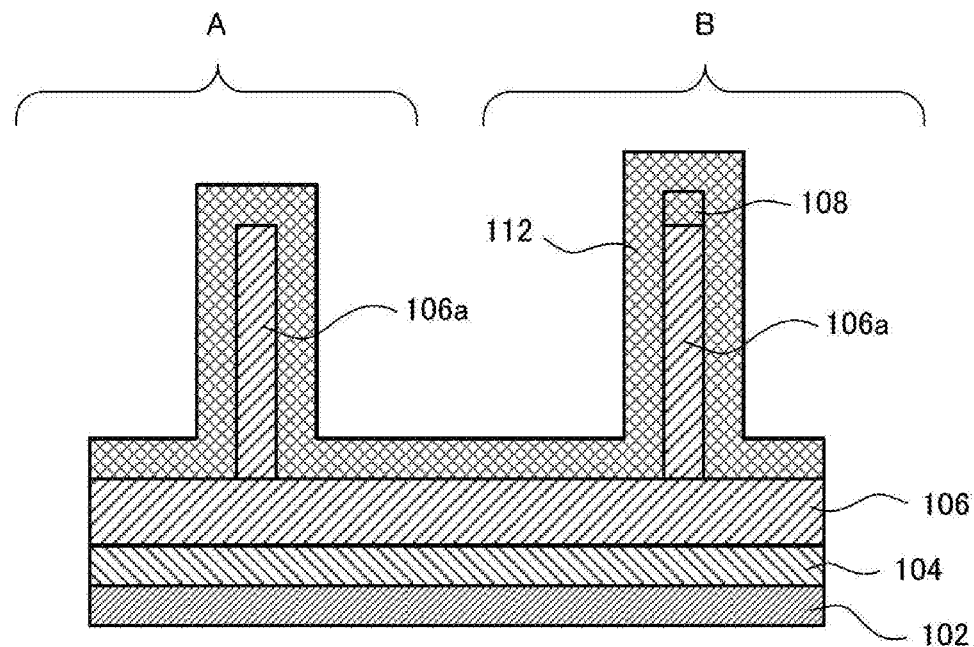

[FIG.12]
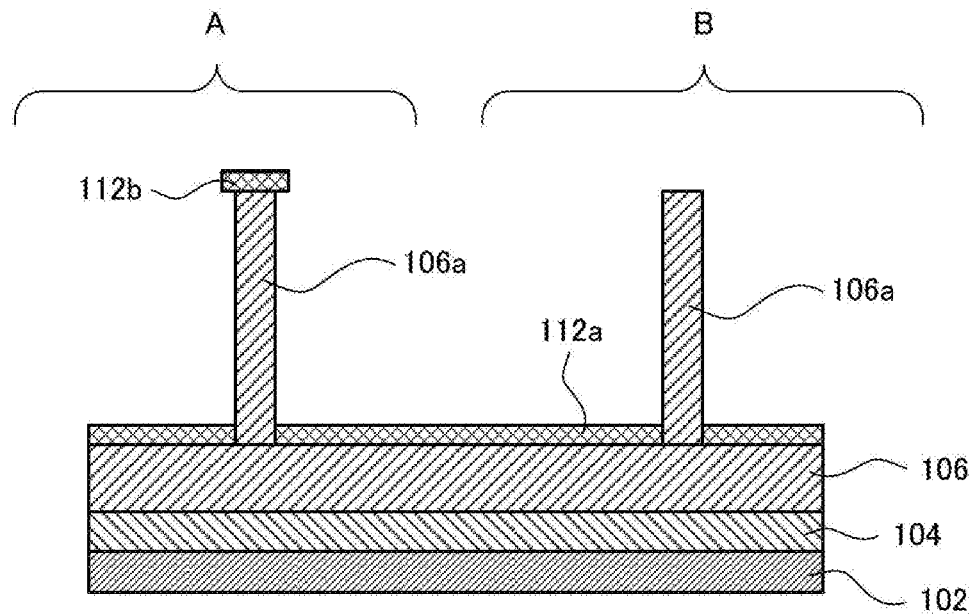
[FIG.13]
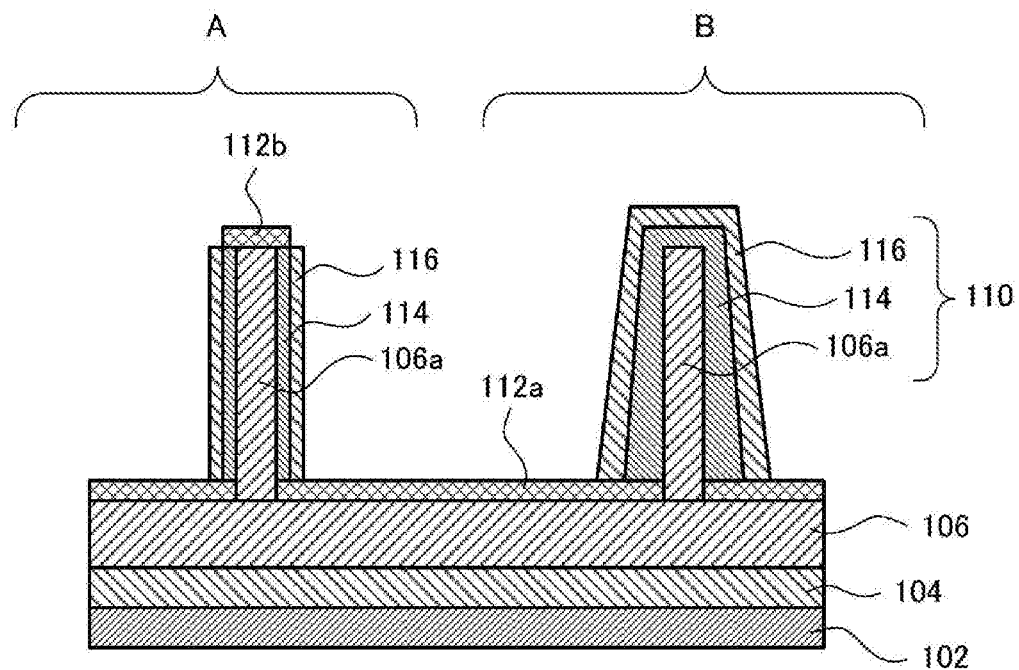

[FIG.14]
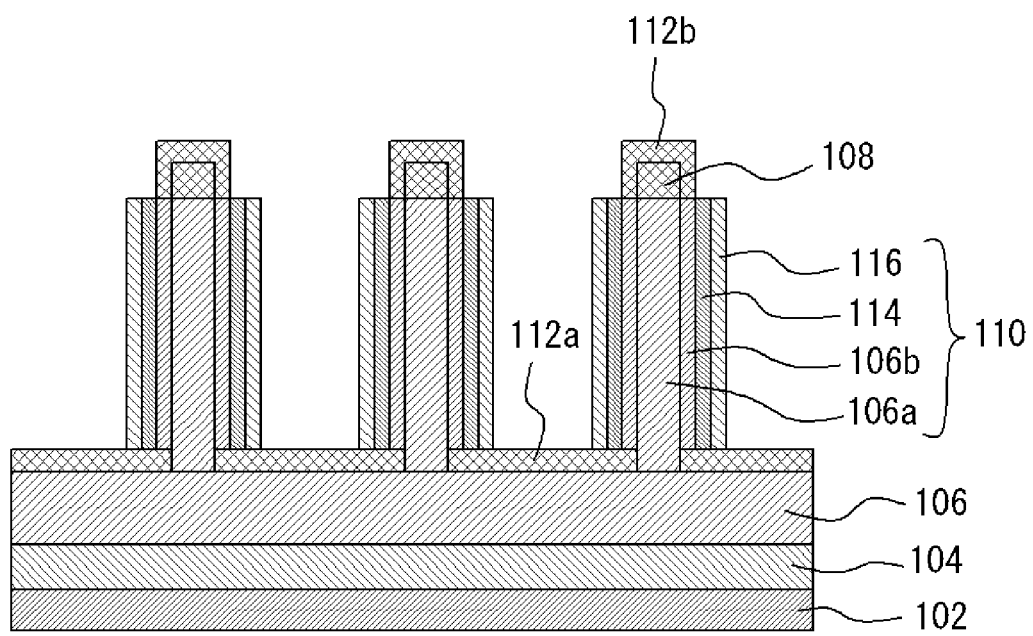

LIGHT-EMITTING ELEMENT AND METHOD OF MANUFACTURING SAME

CROSS-REFERENCE TO RELATED APPLICATION

The present application claims priority under 35 U. S. C. § 119 to Japanese Patent Application No. 2018-244450, filed Dec. 27, 2018, the contents of which are hereby incorporated by reference in their entirety.

BACKGROUND

The present disclosure relates to a light-emitting element and a method of manufacturing the light-emitting element.

Background art of the present technical field includes Japanese Patent Publication No. 2015-126048. Japanese Patent Publication No. 2015-126048 ("JP '048") discloses a method of manufacturing a rod-type light-emitting element as shown in FIG. 7 thereof. An n-type GaN layer 72 is formed on a principal surface of a sapphire substrate 70, and a mask 74 is formed on the n-type GaN layer 72. Subsequently, a plurality of rod-shaped (rod-type) n-type GaN members 72A are formed by etching. A plurality of rod-type light-emitting elements can be created by using the rod-shaped n-type GaN members 72A as a semiconductor core 12 to form a light-emitting layer 14 and a p-type semiconductor layer 16 on a lateral surface thereof and further forming a transparent conductive film 30 (refer to paragraphs [0057] to in JP '048).

SUMMARY

In JP '048, the plurality of formed rod-type light-emitting elements are ultimately separated from the sapphire substrate 70 (refer to FIG. 7H of JP '048). However, minute rod-type light-emitting elements separated from a substrate in this manner are difficult to handle. On the other hand, leaving the plurality of rod-type light-emitting elements formed by the method described in JP '048 on the substrate instead of separating the plurality of rod-type light-emitting elements from the substrate (refer to FIG. 7G of JP '048) reduces the difficulty of handling. However, in this case, the transparent conductive film 30 forming a p-electrode is directly formed on a surface of the substrate 70. In addition, the substrate 70 is a sapphire substrate with an insulating property, and the semiconductor cores 12 that are n-type semiconductors of the light-emitting elements are not electrically connected to each other. Such a configuration requires that, in order to energize the semiconductor cores 12, n-electrodes be formed with high accuracy so as to prevent the n-electrodes from coming into contact with the transparent conductive film 30 forming a p-electrode.

The present disclosure provides a light-emitting element having a plurality of rod-type light-emitting sections and a method of readily manufacturing such a light-emitting element.

According to one embodiment, a method of manufacturing a light-emitting element includes: forming a plurality of masks in forms of islands on a surface of a first conductive semiconductor layer; forming a plurality of rods of a first conductive semiconductor by partially removing, in a depth direction, the first conductive semiconductor layer in a portion exposed from the masks by etching; forming an insulating film on the rods and a surface of the remaining first conductive semiconductor layer; performing wet etching, in a state in which a mask covering the insulating film is not formed, to remove a first portion of the insulating film on lateral surfaces of the rods but retaining a second portion of the insulating film on a surface of the first conductive semiconductor layer; forming a plurality of light-emitting layers covering the lateral surfaces of the rods; and forming a plurality of second conductive semiconductor layers covering outer peripheries of the light-emitting layers.

According to another embodiment, a light-emitting element includes: a first conductive semiconductor layer; a plurality of rods of a first conductive semiconductor disposed on the first conductive semiconductor layer; a first insulating film disposed on a surface of the first conductive semiconductor layer while being absent under the rods; a plurality of light-emitting layers disposed on lateral surfaces of the rods; a plurality of second conductive semiconductor layers disposed on outer sides of the light-emitting layers; and a plurality of second insulating films disposed at upper ends of the rods.

According to certain embodiments of the present disclosure, a light-emitting element having a plurality of rod-type light-emitting sections can be obtained and such a light-emitting element can be readily manufactured.

BRIEF DESCRIPTION OF THE DRAWINGS

FIG. 1 is a flow chart schematically showing a first embodiment;

FIG. 2 is a sectional view schematically showing a state in which masks in forms of islands are formed on a surface of a first conductive semiconductor layer in the first embodiment;

FIG. 3 is a sectional view schematically showing a state in which rods are formed by etching the first conductive semiconductor layer shown in FIG. 2;

FIG. 4 is a sectional view schematically showing a state in which an insulating film is formed on surfaces of the rods and the like shown in FIG. 3;

FIG. 5 is a sectional view schematically showing a state in which the insulating film on lateral surfaces of rods have been removed by etching;

FIG. 6 is a sectional view schematically showing a state in which a light-emitting layer and a second conductive semiconductor layer are formed on lateral surfaces of rods;

FIG. 7 is a sectional view schematically showing a light-emitting element formed according to a second embodiment;

FIG. 8 is a flow chart schematically showing a third embodiment;

FIG. 9A is a sectional view schematically showing a state in which masks in forms of islands are formed on a surface of a first conductive semiconductor layer in the third embodiment;

FIG. 9B is a sectional view schematically showing a state in which a resist mask is formed after forming rods in the third embodiment;

FIG. 10 is a sectional view schematically showing a state in which masks in forms of islands of a first mask group shown in FIG. 9B have been removed;

FIG. 11 is a sectional view schematically showing a state in which an insulating film is formed on surfaces of the rods and the like shown in FIG. 10;

FIG. 12 is a sectional view schematically showing a state in which the insulating film on lateral surfaces of rods have been removed by etching;

FIG. 13 is a sectional view schematically showing a state in which a light-emitting layer and a second conductive semiconductor layer are formed on an outer periphery of rods; and FIG. 14 is a sectional view schematically showing a state in which an n-type semiconductor layer, a light-emitting layer and a second conductive semiconductor layer are formed on lateral surfaces of rods.

DETAILED DESCRIPTION

Hereinafter, embodiments of the present invention will be described with reference to the drawings.

First Embodiment

FIG. 1 is a flow chart schematically showing a method of manufacturing a light-emitting element according to a first embodiment of the present invention. The manufacturing method according to the first embodiment includes: a step S102 of forming an n-type semiconductor layer; a step S104 of forming masks in forms of islands; a step S106 of forming rods; a step S108 of forming an insulating film; an etching step S110; a step S112 of forming a light-emitting layer; and a step S114 of forming a p-type semiconductor layer. It should be noted that, in the present embodiment, an "n-type" will be referred to as a "first conductive type" and a "p-type" will be referred to as a "second conductive type".

FIG. 2 is a sectional view schematically showing a state in which masks in forms of islands are formed on a surface of an n-type semiconductor layer in the first embodiment. In order to form a structure shown in FIG. 2, first, in step S102, with one principal surface 102a of a substrate 102 as a growth surface, a buffer layer 104 is formed on the principal surface 102a and, subsequently, an n-type semiconductor layer 106 is formed on the buffer layer 104. As the substrate 102, for example, a sapphire ($Al_2O_3$) substrate, a SiC substrate, or a nitride semiconductor substrate can be used. As the buffer layer 104, for example, nitride semiconductors such as GaN and AlN can be used. As the n-type semiconductor layer 106, for example, nitride semiconductors such as n-type GaN-based semiconductors can be used. In the present embodiment, an example will be described in which a sapphire substrate is used as the substrate 102, a GaN layer is used as the buffer layer 104, and an n-type GaN layer is used as the n-type semiconductor layer 106. As a reaction apparatus for forming the buffer layer 104 and the n-type semiconductor layer 106, for example, a MOCVD apparatus can be used. The buffer layer 104 may be omitted. It should be noted that FIG. 2 is a schematic view, and a magnitude relationship among thicknesses of the respective parts is not necessarily consistent with an actual magnitude relationship. For example, the substrate 102 is around several hundreds of μm, the buffer layer 104 is around several tens of nm, and the n-type semiconductor layer 106 ranges from several hundreds of nm to several μm.

A crystal plane of the sapphire substrate with Miller indices of (0001) is preferably used as the principal surface 102a that is the growth surface. A "(0001) plane" as referred to herein also includes planes that are slightly inclined with respect to the (0001) plane. Specifically, more preferably, a plane with an off angle of 2.0 degrees or less with respect to the (0001) plane is adopted as the growth surface. For example, an upper surface of a nitride semiconductor (an upper surface of the n-type semiconductor layer 106) formed on the (0001) plane of the substrate 102 is assumed to be (0001).

For example, the buffer layer 104 made of GaN can be formed on the substrate 102 by setting a temperature of the substrate to be in a range of 102° C. to 550° C. and supplying raw material gas. In this case, trimethyl gallium (TMG) or triethyl gallium (TEG) can be used as a raw material gas of gallium and $NH_3$ can be used as a raw material gas of nitrogen. The thickness of the buffer layer 104 is set to, for example, approximately 20 nm. Amorphous GaN may be formed as the buffer layer 104 and a heat treatment may be subsequently performed.

An n-type GaN layer is formed as the n-type semiconductor layer 106 on the buffer layer 104. As the n-type GaN layer, for example, a Si-added GaN layer can be formed. A Si-added GaN layer can be formed by adding silane gas to the raw material gas described above.

Next, in step S104 of forming masks in forms of islands, a plurality of masks 108 are formed on a surface of the n-type semiconductor layer 106. For the masks 108, a material with an etching rate with respect to etching to be performed in step S106 of forming rods (to be described later) that is lower than that of the n-type semiconductor layer 106 can be used. Examples of materials that can be used in the masks 108 include $SiO_2$ and SiN. For example, after forming a $SiO_2$ film on an entire surface of the n-type semiconductor layer 106, the masks 108 can be formed using a lithographic technique such as nanoimprint lithography, photolithography, or electron beam lithography and by etching. Examples of methods for forming the $SiO_2$ layer include a CVD method. A pattern of the masks 108 may have various shapes such as a circular shape and a polygonal shape. A circular shape is suitable as a fine pattern. FIG. 2 schematically shows a state in which the buffer layer 104 and the n-type semiconductor layer 106 have been sequentially stacked on the substrate 102 and the masks 108 have been formed.

FIG. 3 is a sectional view schematically showing a state in which rods are formed by etching the n-type semiconductor layer shown in FIG. 2. In step S106 of forming rods, the n-type semiconductor layer 106 in a portion exposed from the masks 108 is partially removed in a depth direction by dry etching and a plurality of rods 106a of an n-type semiconductor are formed as shown in FIG. 3. As an etching gas, for example a mixed gas of $Cl_2$ gas and $SiCl_4$ gas can be used. In the present step, because the n-type semiconductor layer 106 is partially removed in the depth direction, the n-type semiconductor layer 106 still remains under the plurality of formed rods 106a. Therefore, because the plurality of rods 106a are electrically connected through the n-type semiconductor layer 106 that is present under the rods 106a, energization can be readily performed. In other words, by energizing the n-type semiconductor layer 106, all of the plurality of rods 106a can be energized. For this reason, there is no need to form an n-electrode on each of the rods 106a, and forming only one n-electrode that is electrically connected to the n-type semiconductor layer 106 may suffice. It should be noted that there may not be only one n-electrode. For example, a plurality of n-electrodes that are fewer than the rods 106a may be provided. In addition, not all rods 106a need be simultaneously driven. For example, even when there is only one n-electrode, providing a plurality of mutually independent p-electrodes enables rods 106a with different p-electrodes to be individually driven.

A GaN-based crystal has a wurtzite (hexagonal system) crystal structure. When the rod 106a is formed by etching the n-type semiconductor layer 106 of which an upper surface is (0001) plane in a depth direction (a [000-1] direction of the crystal), the rod 106a first assumes a shape corresponding to a shape of the mask 108. Subsequently, when the light-emitting layer (to be described later) and the like are grown, an outer shape of the light-emitting layer and the like may assume a hexagonal column shape. At this point, a lateral surface of the hexagonal column-shaped rod-like stack becomes an m-surface of a GaN-based crystal. When a diameter of the mask 108 is large, a thickness of the rod 106a increases accordingly. Therefore, the thickness of the rod 106a can be controlled by the diameter of the mask 108.

As a method of forming a semiconductor rod, for example, a mask of an insulating film having a plurality of through-holes can be formed on the upper surface of the n-type semiconductor layer 106, and the semiconductor rod can be formed by selectively growing from the upper surface of the n-type semiconductor layer 106 that is exposed from the through-holes in a direction perpendicular to the upper surface of the n-type semiconductor layer 106. Compared to such a selective growth method, a method of forming a rod by etching as in the present embodiment is advantageous in that a variation in lateral sizes (diameters or the like) of the rods can be reduced, a variation in heights of the rod portions can be reduced, and the like. The closer the heights of the rods are to being uniform, the smaller a vertical difference among the rods, which enables more advantages to be gained, such as making p-electrodes and the like more readily formable and making junction-down mounting more readily achievable.

FIG. 4 is a sectional view schematically showing a state in which an insulating film is formed on surfaces of the rods and the like shown in FIG. 3. In step S108 of forming an insulating film 112, the insulating film 112 is formed on surfaces of the rods 106a and the remaining n-type semiconductor layer 106. While $SiO_2$, SiN, and the like can be exemplified as the insulating film 112, in the present embodiment, an example using $SiO_2$ will be described. The insulating film 112 is preferably formed by a sputtering method. Forming the insulating film 112 by a sputtering method causes an etching rate of the insulating film 112 formed on lateral surfaces of the rods 106a in a next etching step to be higher than an etching rate of the insulating film 112 formed in other portions. This is conceivably due to density of the insulating film 112 formed on the lateral surfaces of the rods 106a being lower than that of the insulating film 112 formed in other portions. Because the formation of such films in which density differs according to a formation position is conceivably dependent on anisotropy of sputter, for example, the difference in density can conceivably be made more apparent by increasing a distance between a target and a sample, increasing a degree of vacuum, or the like. It should be noted that the rods 106a are preferably subjected to wet etching prior to forming the insulating film 112. Accordingly, portions damaged by dry etching can be removed and, at the same time, lateral surfaces of the rods 106a can be brought closer to vertical with respect to the principal surface of the substrate 102.

FIG. 5 is a sectional view schematically showing a state in which the insulating film on the lateral surfaces of rods have been removed by etching. In etching step S110, wet etching is performed in a state in which a mask covering the insulating film 112 is not formed. Accordingly, the insulating film 112 on the lateral surfaces of the rods 106a can be removed but the insulating film 112 on the surface of the n-type semiconductor layer 106 can be retained. When the insulating film 112 is $SiO_2$, buffered hydrofluoric acid (BHF) can be used as an etching solution.

As described above, the insulating film 112 formed on the lateral surfaces of the rods 106a has a higher etching rate than the insulating film 112 formed in other portions. Therefore, when wet etching is performed without forming a mask for covering the insulating film 112, the insulating film 112 formed on the lateral surfaces of the rods 106a is completely removed before the insulating film 112 formed in other portions. Etching time is controlled so as to stop etching in a state in which the insulating film 112 of the lateral surfaces of the rods 106a is removed and the lateral surfaces of the rods 106a are exposed but the insulating film 112 on the surface of the n-type semiconductor layer 106 still remains. Accordingly, a state in which the insulating film 112 is present on the surface of the n-type semiconductor layer 106 but the insulating film 112 is absent from the lateral surfaces of the rods 106a can be created. FIG. 5 schematically shows a state in which such etching has been completed. As shown in FIG. 5, for the sake of brevity, the insulating film 112 remaining on the surface of the n-type semiconductor layer 106 will be referred to as a first insulating film 112a, and the insulating film 112 remaining on upper ends of the rods 106a will be referred to as a second insulating film 112b. In this manner, the second insulating film 112b may be retained on the upper ends of the rods 106a.

FIG. 6 is a sectional view schematically showing a state in which a light-emitting layer and a second conductive semiconductor layer are formed on lateral surfaces of rods. In step S112 of forming a light-emitting layer, a light-emitting layer 114 covering the lateral surfaces of the rods 106a is formed. An n-type semiconductor layer is preferably formed on the lateral surfaces of the rods 106a prior to forming the light-emitting layer 114. Although regrowth is to be performed on the surface of the rods 106a when forming the rods 106a by etching, growing an undoped layer on the surface of the n-type rods 106a may cause a voltage rise depending on an impurity level on a regrowth interface. Therefore, preferably, as shown in FIG. 14, an n-type semiconductor layer 106b is first formed on a surface of the n-type rods 106a and, subsequently, the light-emitting layer 114 is grown. Accordingly, a voltage rise can be suppressed. The light-emitting layer 114 may have a multi-quantum well (MQW) structure. For example, the light-emitting layer 114 may be constructed by alternately stacking a GaN barrier layer and an InGaN well layer a plurality of times. By adjusting formation conditions of the light-emitting layer 114, the light-emitting layer 114 that emits light of various wavelengths can be formed. For example, the light-emitting layer 114 that emits blue light can be formed by setting the temperature of the substrate 102 to around 800° C. to 900° C. and supplying raw material gas. As raw materials, for example, TMG or TEG can be used as a gallium source, $NH_3$ can be used as a nitrogen source, and trimethyl indium (TMI) can be used as an indium source.

In next step S114 of forming a p-type semiconductor layer, a p-type semiconductor layer 116 is formed so as to cover an outer periphery of the light-emitting layer 114. The p-type semiconductor layer 116 may be a p-type GaN-based semiconductor. The p-type semiconductor layer 116 may be formed by stacking a p-type GaN layer or a p-type AlGaN layer a plurality of times while varying a p-type impurity concentration thereof. For example, the p-type semiconductor layer 116 can be formed by setting the temperature of the substrate 102 to be in a range of about 800° C. to 900° C. and supplying raw material. TMG or TEG can be used as a raw material to be a gallium source and $NH_3$ can be used as a raw material to be a nitrogen source. When adding Mg as a p-type impurity, for example, $Cp_2Mg$ (bis(cyclopentadienyl) magnesium) can be used as a raw material. FIG. 6 shows a state in which the light-emitting layer 114 and the p-type semiconductor layer 116 have been formed on lateral surfaces of the rods 106a. It should be noted that further layers other than those described above may be provided. For example, an undoped layer may be provided between the light-emitting layer 114 and the p-type semiconductor layer 116.

As shown in FIG. 6, by forming the p-type semiconductor layer 116, a rod-like stack 110 including the rod 106a, the light-emitting layer 114, and the p-type semiconductor layer 116 is completed. The rod-like stack 110 constitutes a light-emitting section of the light-emitting element according to the present embodiment. When growing the light-emitting layer 114 and the p-type semiconductor layer 116 on the lateral surface of the rods 106a, an interval between rods 106a that are adjacent to each other may affect a growth rate and a composition of the light-emitting layer 114 and the p-type semiconductor layer 116. The "interval between rods 106a" as referred to herein may be paraphrased as an interval between centers of masks 108 when the masks 108 shown in FIG. 2 are viewed from above. This is because a position of the rod 106a to be formed is determined by a position of the center of the mask 108. It should be noted that an "interval between rod-like stacks 110" refers to the same interval. Arranging the plurality of rods 106a at substantially constant intervals enables growth rates of the light-emitting layer 114 and the p-type semiconductor layer 116 formed on the lateral surfaces of the rods 106a to be made substantially constant. When sizes of the plurality of masks 108 are not constant, the "interval between rods 106a" will refer to a shortest distance between the masks 108.

For example, in a top view of the masks 108 formed in step S104, by arranging the masks 108 in forms of islands in an equilateral-triangular lattice, the intervals of the rods 106a formed in step S106 can be made substantially constant. Furthermore, preferably, a direction connecting the centers of the masks 108 in a top view is an m-axis direction of a GaN-based crystal constituting the rods 106a or, in other words, an a-axis direction of sapphire constituting the substrate 102. Accordingly, in hexagonal rods 106a arranged in an equilateral-triangular lattice, lateral surfaces of adjacent rods 106a can substantially each other so as to be substantially parallel. In this case, growth rates of the light-emitting layer 114 and the p-type semiconductor layer 116 formed on each lateral surface of each rod 106a can be made substantially constant and film thicknesses of the light-emitting layer 114 and the p-type semiconductor layer 116 formed on each rod 106a are allowed to have uniform film thicknesses.

As shown in FIG. 6, according to the first embodiment described above, a light-emitting element is formed that includes: an n-type semiconductor layer 106; a plurality of rods 106a of an n-type semiconductor formed on the n-type semiconductor layer 106; a first insulating film 112a that is formed on a surface of the n-type semiconductor layer 106 while being absent under the rods 106a; a light-emitting layer 114 stacked on lateral surface of the rods 106a; a p-type semiconductor layer 116 stacked on an outer side of the light-emitting layer 114; and a second insulating film 112b formed at upper ends of the rods 106a.

The first insulating film 112a formed on the surface of the n-type semiconductor layer 106 is capable of preventing leakage due to the p-type semiconductor layer 116 and the n-type semiconductor layer 106 coming into contact with each other. As is conventional, providing a mask so that the insulating film 112 is not formed on the lateral surfaces of the rods 106a and attempting to form the insulating film 112 only on the surface of the n-type semiconductor layer 106 necessitates adding many steps to a manufacturing process. In particular, when the sizes of the rods 106a are small or the intervals between adjacent rods 106a are narrow, requirements for mask precision is extremely high. A photolithographic process of forming such a resist mask requires complicated steps such as positioning a photomask with high precision requirement, which in turn prolongs manufacturing cycles and raises manufacturing cost. In the present embodiment, in step S108, by simply forming the insulating film 112 on entire surfaces of the rods 106a and the n-type semiconductor layer 106 and performing wet etching without forming a mask, the insulating film 112 on the lateral surfaces of the rods 106a can be removed while retaining the first insulating film 112a on the surface of the n-type semiconductor layer 106. Accordingly, because a formation process of the first insulating film 112a is simplified, manufacturing throughput can be improved and, furthermore, manufacturing cost can be reduced.

Next, by forming a p-electrode to be connected to the p-type semiconductor layer 116 and an n-electrode to be connected to the n-type semiconductor layer 106, the light-emitting element can be driven through the p-electrode and the n-electrode to perform light emission. Alternatively, before forming the p-electrode, an electrode film that covers the plurality of rod-like stacks 110 may be formed and the p-electrode may be formed on the electrode film. Accordingly, the plurality of rod-like stacks 110 can be simultaneously driven by one p-electrode.

As the electrode film, for example, a conductive oxide film such as indium tin oxide (ITO), indium zinc oxide (IZO), ZnO, or $InGaZnO_4$ or an Ag film can be used. The electrode film is preferably a monolayer film. Because a monolayer film enables a process of forming the electrode film and a subsequent wet etching process to be simplified as compared to using a multilayer film, manufacturing throughput can be improved and cost can be reduced. Forming a transparent film such as an ITO film as the electrode film has an advantage of making it easier to extract light emitted by the light-emitting layer 114. The electrode film can be formed by a sputtering method without providing a resist mask.

In the present specification, expressions including "up", "down", "left", and "right" that are used when expressing an orientation, a position, or the like of a component, such as "upper" in "upper surface" described above, represent a relative orientation, position, or the like among components in the drawings and are not intended to indicate an absolute position unless explicitly stated. For example, while the "upper surface" of the n-type semiconductor layer 106 described above represents a principal surface of the n-type semiconductor layer 106 that is not in contact with the buffer layer 104, because the "upper surface" of the n-type semiconductor layer 106 faces upward in FIG. 2, the term "upper surface" is used for the sake of convenience.

Second Embodiment

FIG. 7 is a sectional view schematically showing a light-emitting element formed according to a second embodiment. The present embodiment is a modification of the first embodiment. In the present embodiment, parts, members, portions, and elements having same functions as those in the first embodiment will be denoted by same reference characters as used in the first embodiment and descriptions thereof may be omitted. The present embodiment differs from the first embodiment in step S104 of forming masks in forms of islands. In step S104 according to the present embodiment, the plurality of masks 108 are formed so that the plurality of rods 106a formed in step S106 of forming rods include a first rod group A having a first interval d1 and a second rod group B having a second interval d2 that is wider than the first interval d1.

As described above, the positions of the rods 106a to be formed are determined by the positions of the masks 108. Therefore, setting intervals between the centers of adjacent masks 108 to the first interval d1 also causes the intervals between the formed rods 106a to be set to the first interval d1. Setting intervals between the centers of adjacent masks 108 to the second interval d2 also causes the intervals between the formed rods 106a to be set to the second interval d2. The plurality of rods 106a having the first interval d1 form the first rod group A and the plurality of rods 106a having the second interval d2 form the second rod group B.

As shown in FIG. 7, according to the present embodiment, a light-emitting element can be formed that includes, on a same substrate, the first rod group A having the first interval d1 and the second rod group B having the second interval d2 that is wider than the first interval d1. As a modification of the present embodiment, a third rod group having a third interval, a fourth rod group having a fourth interval, and the like may be further formed on the same substrate. It should be noted that rods positioned at boundaries between the respective rod groups tend to assume shapes that represent a mixture of characteristics of both rod groups. Therefore, the rods positioned at boundaries between the respective rod groups are preferably removed after formation.

The intervals between adjacent rods 106a also affect an amount of incorporation of In by an InGaN well layer in the light-emitting layer 114. When the intervals between the rods 106a differ although a flow rate of In raw material gas is the same, the wider the intervals between the rods 106a, the larger the amount of In incorporated into the InGaN well layer. The higher the ratio of In in the InGaN well layer, the greater the shift of a wavelength of light emitted by the InGaN well layer to a long wavelength side. Therefore, by adjusting the intervals between the rods 106a, rod-like stacks 110 that emit light with different wavelengths can be formed. For example, rod-like stacks 110 of the three RGB colors can be formed on the same substrate 102. Because the second interval d2 between the rods 106a in the second rod group B is wider than the first interval d1 between the rods 106a in the first rod group A, an emission wavelength of the second rod group B is longer than an emission wavelength of the first rod group A.

When forming the rods 106a by a selective growth method, changing the intervals between the rods 106a makes the diameter of the rods 106a susceptible to change. With a method of forming the rods 106a by etching as in the present embodiment, a uniform diameter of the rods 106a can be more readily realized even when a plurality of rod groups with different intervals are formed on the same substrate. A "diameter" as described herein refers to a dimension of a maximum width of a cross section of the rod 106a.

When the upper surface of the rod 106a is (0001) plane, increasing the intervals between the rods 106a as in the second rod group B shown in FIG. 7 enables the light-emitting layer 114 and the p-type semiconductor layer 116 formed on the rods 106a to be made in a tapered shape. The interval between the rods 106a for obtaining such a shape is, for example, around 2.5 μm. When the light-emitting layer 114 and the p-type semiconductor layer 116 have a tapered shape, the wavelength of light emitted by the light-emitting element more readily shifts to the long wavelength side as compared to a case where the light-emitting layer 114 and the p-type semiconductor layer 116 do not have a tapered shape. This is conceivably due to the fact that, when the light-emitting layer 114 has a tapered shape, the amount of In incorporated into the well layer of the light-emitting layer 114 increases. When the upper surface of the rod 106a is not flat, the upper surface of the rod 106a being (0001) plane may be paraphrased as the height direction of the rod 106a being a [0001] direction.

Third Embodiment

The present embodiment is a modification of the second embodiment and the first embodiment. In the present embodiment, parts, members, portions, devices, and elements having same functions as those in the second embodiment will be denoted by same reference characters as used in the second embodiment, and descriptions thereof may be omitted.

FIG. 8 is a flow chart schematically showing the third embodiment. The present embodiment mainly differs from the second embodiment in that the present embodiment includes step S800 of removing the masks 108 of a first mask group corresponding to the first rod group A but retaining the masks 108 of a second mask group corresponding to the second rod group B between step S106 of forming rods and step S108 of forming an insulating film. Step S800 is further divided into step S802 of forming a resist mask and step S804 of removing the masks in forms of islands of the first mask group. The respective steps prior to step S800 are the same as those in the first embodiment and a description thereof will be omitted.

FIG. 9A is a sectional view schematically showing a state in which masks in forms of islands are formed on a surface of a first conductive semiconductor layer in the third embodiment. FIG. 9B is a sectional view schematically showing a state in which a resist mask is formed after forming rods in the third embodiment. In FIG. 9A, a mask 108 on a left side belongs to a first mask group A having the first interval and a mask 108 on a right side belongs to a second mask group B having the second interval. In FIG. 9B, a rod 106a on a left side belongs to the first rod group A having the first interval d1 and a rod 106a on a right side belongs to the second rod group B having the second interval d2. The first rod group corresponds to the first mask group, and the second rod group corresponds to the second mask group. In step S802, a resist mask 202 that covers the second rod group B but does not cover the first rod group A is formed.

FIG. 10 is a sectional view schematically showing a state in which masks 108 in forms of islands of the first mask group corresponding to the first rod group A shown in FIG. 9B have been removed. In step S804, the masks 108 on an upper end of the rods 106a of the first rod group A are removed by wet etching. BHF can be used as an etching solution. Subsequently, the resist mask 202 is removed.

FIG. 11 is a sectional view schematically showing a state in which an insulating film is formed on surfaces of the rods and the like shown in FIG. 10. In step S108 of forming an insulating film, the insulating film 112 is formed on surfaces of the rods 106a and the remaining n-type semiconductor layer 106. The insulating film 112 and the masks 108 have different etching rates with respect to an etching solution used in subsequent etching step S110, with the etching rate of the masks 108 being higher. In the present embodiment, for example, in step S104 of forming masks in forms of islands, SiO$_2$ masks 108 in forms of islands are formed by a CVD method, and in step S108 of forming an insulating film, a SiO$_2$ insulating film 112 is formed by a sputtering method. By using such methods, the etching rate of the masks 108 is made higher than the etching rate of the insulating film 112 with respect to the etching solution used in subsequent etching step S110.

FIG. 12 is a sectional view schematically showing a state in which the insulating film on the lateral surfaces of rods have been removed by etching. In etching step S110, the insulating film 112 on the lateral surfaces of the rods 106a is removed by wet etching. BHF can be used as an etching solution. In this case, because the etching rate of the masks 108 is higher, the masks 108 at the upper ends of the rods 106a in the second rod group B are removed and, accordingly, the second insulating film 112 on the masks 108 is also removed. Because the upper surface of the rods 106a in the first rod group A is a flat surface similar to the upper surface of the n-type semiconductor layer 106, the second insulating film 112b provided on the upper surface of the rods 106a is retained in a similar manner to the first insulating film 112a on the n-type semiconductor layer 106.

FIG. 13 is a sectional view schematically showing a state in which a light-emitting layer and a second conductive semiconductor layer are formed on an outer periphery of rods. In step S112, the light-emitting layer 114 is formed, and in step S114, the p-type semiconductor layer 116 is formed. In this case, because the second insulating film 112b is present at the upper end of the rods 106a in the first rod group A, the light-emitting layer 114 and the p-type semiconductor layer 116 are only formed on the lateral surfaces of the rods 106a. On the other hand, because neither the second insulating film 112b nor the mask 108 is present at the upper end of the rods 106a in the second rod group B, the light-emitting layer 114 and the p-type semiconductor layer 116 are not only formed on the lateral surfaces of the rods 106a but also formed on the upper ends of the rods 106a.

A growth rate of semiconductor layers on the lateral surfaces of the rods 106a is low. In particular, when the light-emitting layer 114 and the p-type semiconductor layer 116 are given tapered shapes as in the rod-like stacks 110 in the second rod group B, the growth rate further decreases. However, if the light-emitting layer 114 and the p-type semiconductor layer 116 also grow on the upper surface of the rods 106a in the second rod group B, the growth rates of the light-emitting layer 114 and the p-type semiconductor layer 116 on the lateral surfaces can be increased.

In each embodiment of the present invention, a light-emitting element having a plurality of rod-type light-emitting sections can be obtained. Moreover, the first insulating film 112a that prevents leakage between the p-type semiconductor layer 116 and the n-type semiconductor layer 106 can be readily formed on the surface of the n-type semiconductor layer 106. Accordingly, manufacturing throughput can be improved and manufacturing cost can be reduced.

Furthermore, according to the second embodiment and the third embodiment, the rod-like stacks 110 that emit light with different wavelengths can be formed on a same substrate. In addition, a structure of a light-emitting element that enables an In content of a well layer in the light-emitting layer 114 to be readily increased can be provided.

The present invention is not limited to the embodiments described above, and encompasses various modifications. For example, while an "n-type" is referred to as a "first conductive type" and a "p-type" is referred to as a "second conductive type" in the embodiments described above, conversely, a "p-type" may be referred to as the "first conductive type" and an "n-type" may be referred to as a "second conductive type". In addition, while the above embodiments have been described in detail in order to explain the present invention in an easily understood manner, the present invention is not necessarily limited to modes that include all of the components or steps described above. For example, while the buffer layer 104 is formed on the principal surface 102a of the substrate 102 and, subsequently, the n-type semiconductor layer 106 is formed on the buffer layer 104 in step S102 in the embodiments described above, the n-type semiconductor layer 106 may be directly formed on the principal surface 102a of the substrate 102. If the substrate 102 is constituted by an n-type semiconductor (for example, an n-type GaN-based semiconductor), step S102 of forming the n-type semiconductor layer 106 may be omitted and n-type rods 106a may be formed by directly forming the masks 108 on the principal surface 102a of the substrate 102.

It should be noted that some of the components of a given embodiment may be replaced with components of another embodiment, and components of the other embodiment may be added to components of the given embodiment. In addition, with respect to a part of the components of each embodiment, others component may be added thereto or the part of the components may be replaced with other components.

What is claimed is:

1. A method of manufacturing a light-emitting element, the method comprising steps of:
    forming a plurality of masks on a surface of a first conductive semiconductor layer;
    forming a plurality of rods comprising a first conductive semiconductor by partially removing, in a depth direction, a portion of the first conductive semiconductor layer exposed from the masks by etching;
    forming an insulating film on the rods and a surface of a remaining portion of first conductive semiconductor layer;
    performing wet etching, in a state in which a mask covering the insulating film is not formed, to remove a first portion of the insulating film on lateral surfaces of the rods but retaining a second portion of the insulating film on a surface of the first conductive semiconductor layer;
    forming a plurality of light-emitting layers covering the lateral surfaces of the rods; and
    forming a plurality of second conductive semiconductor layers covering outer peripheries of the light-emitting layers.

2. The method of manufacturing a light-emitting element according to claim 1, wherein:
    in the step of forming the plurality of masks, the plurality of masks includes a first mask group and a second mask group, and
    in the step of forming the plurality of rods, the plurality of rods includes a first rod group corresponding to the first mask group and having a first interval and a second rod group corresponding to the second mask group and having a second interval that is wider than the first interval.

3. The method of manufacturing a light-emitting element according to claim 2, further comprising:

between the step of forming the plurality of the rods and the step of forming the insulating film, removing the masks of the first mask group but retaining the masks of the second mask group, wherein, in the step of performing wet etching, the masks of the second mask group are also removed by the wet etching.

4. The method of manufacturing a light-emitting element according to claim 3, wherein:

the step of removing the masks of the first mask group comprises:

forming a resist mask covering the second rod group while the first rod group is exposed from the resist mask, removing the masks of the first mask group, and removing the resist mask.

5. The method of manufacturing a light-emitting element according to claim 1, wherein:

the rods comprise GaN-based semiconductors, and an upper surface of each of the rods is (0001) plane.

6. The method of manufacturing a light-emitting element according to claim 1, wherein:

the insulating film is a $SiO_2$ film, and an etching solution used in the step of performing wet etching is buffered hydrofluoric acid (BHF).

7. The method of manufacturing a light-emitting element according to claim 1, wherein:

the first conductive semiconductor layer is an n-type semiconductor layer, and the second conductive semiconductor layers are p-type semiconductor layers.

8. The method of manufacturing a light-emitting element according to claim 7, further comprising:

between the step of performing wet etching and the step of forming the plurality of the light-emitting layers, forming a plurality of n-type semiconductor layers on lateral surfaces of the rods.

* * * * *